United States Patent [19]

Long

[11] 4,191,942
[45] Mar. 4, 1980

[54] SINGLE SLOPE A/D CONVERTER WITH SAMPLE AND HOLD

[75] Inventor: David K. Long, Sunnyvale, Calif.

[73] Assignee: National Semiconductor Corporation, Santa Clara, Calif.

[21] Appl. No.: 913,632

[22] Filed: Jun. 8, 1978

[51] Int. Cl.² .......................................... H03K 13/02
[52] U.S. Cl. ............................. 340/347 AD; 325/142; 340/347 NT
[58] Field of Search ......... 340/347 AD, 206, 347 NT; 332/9; 325/142

[56] References Cited

U.S. PATENT DOCUMENTS

| | | | |
|---|---|---|---|
| 3,555,298 | 1/1971 | Neelands | 340/347 |
| 3,566,397 | 2/1971 | Walton | 340/347 |
| 3,725,903 | 3/1973 | Kosakowski | 340/347 |
| 3,725,905 | 4/1973 | Tunzi | 340/347 |
| 3,739,375 | 6/1973 | Chatelon et al. | 340/347 |
| 3,801,834 | 4/1974 | Lai | 340/347 |
| 3,958,236 | 5/1976 | Kelly | 340/347 |
| 4,015,254 | 3/1977 | Strandt | 340/347 |

Primary Examiner—Malcolm A. Morrison
Assistant Examiner—Gary Chin
Attorney, Agent, or Firm—Gail W. Woodward

[57] ABSTRACT

A converter circuit employs a capacitor coupled through a selector switch to an analog voltage so that the capacitor is charged to the analog level. When a conversion is commanded, the capacitor is disconnected from the analog voltage and discharged through a constant current load. This results in a linear voltage ramp. A comparator senses the capacitor voltage and compares it to a reference level that is slightly above ground. Upon starting the ramp an increment of voltage slightly larger than the reference is applied in series with the capacitor. When the ramp drops below the reference level the comparator output is used to terminate the conversion interval. Thus, the conversion interval is directly and linearly proportional to the magnitude of the analog voltage. If desired, the conversion interval can be used to operate a counter to provide a conventional digital readout. Alternatively, the device can be operated by a microprocessor with the readout being sensed and displayed if desired by the microprocessor. Due to the increment of voltage, the zero analog voltage conversion interval is a fixed finite time.

6 Claims, 2 Drawing Figures

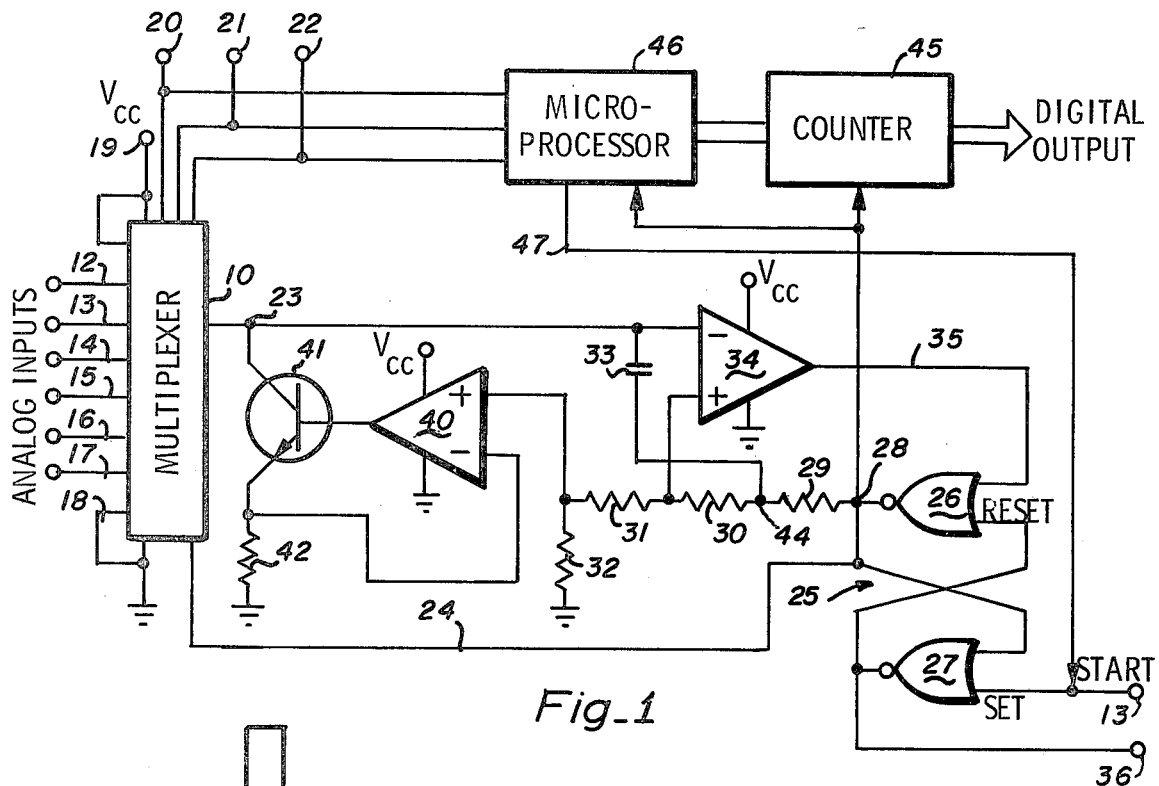
Fig_1
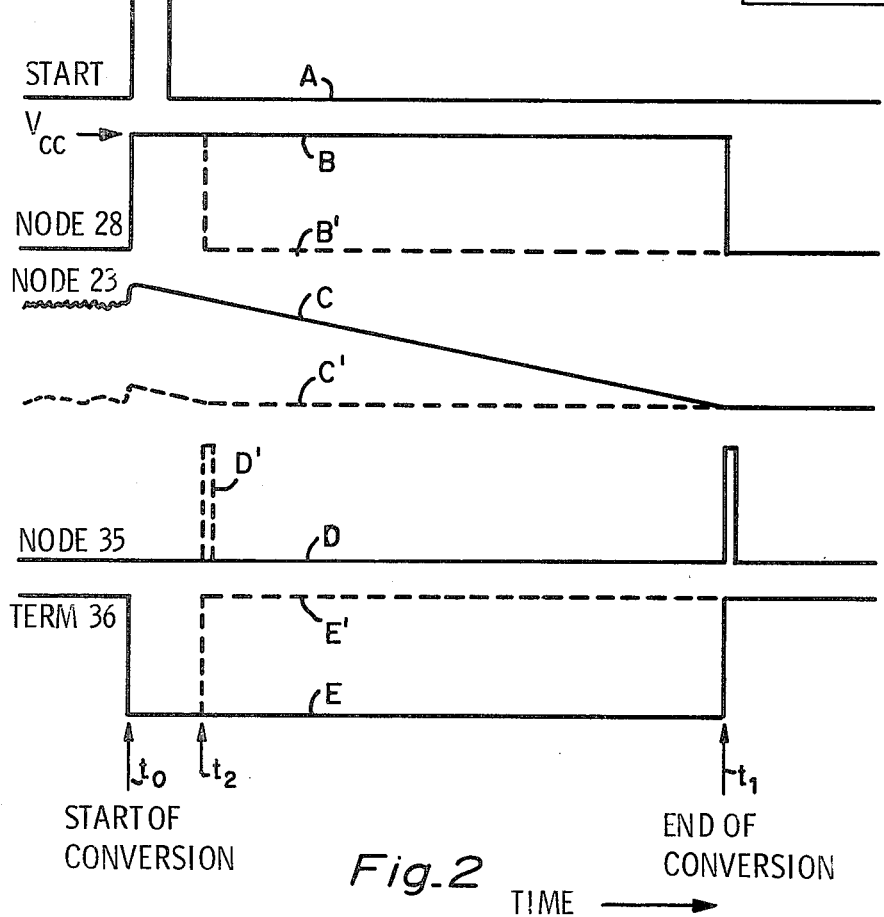
Fig_2

__PATENT_NUMBER__ 4,191,942

SINGLE SLOPE A/D CONVERTER WITH SAMPLE AND HOLD

BACKGROUND OF THE INVENTION

The invention relates to the field of analog to digital (A/D) converters in which an unknown analog voltage is represented by a digital signal equivalent. Many forms of such converters have been developed to act as the interface between digital computers and the analog outputs of transducers that measure the various parameters of the physical environment. Integrating A/D converters employ the integral of the analog voltage over a conversion internal as the digital equivalent. These are usually of the dual slope variety. Kelly U.S. Pat. No. 3,958,236 shows one such dual slope A/D converter with means for injecting an offset voltage having a magnitude and polarity that will correct for drift and offset. Neelands U.S. Pat. No. 3,555,298 shows an A/D converter that employs a capacitor charged to the analog voltage and then discharged through a constant current circuit to provide a linear ramp. A comparator terminates the ramp when a reference potential is reached. The device is alternately supplied with unknown and reference potentials and a corrected digital readout indicates the unknown quantity. Balcom, Jr. U.S. Pat. No. 3,514,634 shows single slope converter in which a voltage is converted to the duration of an output pulse. A reference voltage is converted into a linear ramp and the ramp compared with the analog input. The zero crossing, which varies with the unknown analog, is used to generate a flip-flop action that has an output that is time related to the unknown.

The above systems are generally complicated and involve the use of a substantial number of parts.

SUMMARY OF THE INVENTION

It is an object of the invention to provide a single slope A/D converter which has a conversion range of ground to $V_{CC}$ rail and uses a minimum of parts.

It is a further object of the invention to provide an A/D converter using sample and hold techniques and single slope operation that is compatible with microprocessor control.

These and other objects are achieved in the following circuit arrangement. A sampling switch, which can be a multiplexer, is used to couple an analog input to a capacitor. Upon a start command a control flip-flop produces a signal that turns off the sampling switch and turns on a constant current load device that discharges the capacitor to produce a highly linear ramp. A comparator is used to sense the capacitor charge. The comparator has a reference potential connected to its other input so that when the capacitor charge drops below reference, the comparator switches and its output used to reset the flip-flop. Thus, the flip-flop output pulse duration is directly proportional to the original capacitor charge which was equal to the analog signal value just prior to the start command. The flip-flop output is also used to produce a potential increment that is slightly larger than the comparator reference and this increment is added to the capacitor charge. Thus, even if the analog input is zero, the increment insures that there will be a finite time-out. If desired, the flip-flop can be used to operate a counter so that the pulse width readout can be translated to a digital word.

Since only a start command is needed and the flip-flip state directly read out, the A/D converter is amanable to microprocessor control. In this case the input device is desirably a multiplexer with the input being selected by a digital word address. In one mode one multiplexer input is coupled to ground, a second to $V_{CC}$ and a third (or more) input coupled to an unknown voltage. The microprocessor can then include a software subroutine that produces the following steps. First, convert the grounded input, then convert the $V_{CC}$ input, and then convert the unknown. Subtract the ground reading from the $V_{CC}$ reading and divide the result into the unknown reading. The result is the unknown expressed as a fraction of $V_{CC}$. If an absolute value is desired, it is only necessary to know $V_{CC}$. This subroutine eliminates all but linearity errors which can be kept small by using a highly regulated constant current capacitor discharge circuit.

BREIF DESCRIPTION OF THE DRAWING

FIG. 1 is a partial schematic block diagram of the circuit of the invention; and FIG. 2 is a waveform graph showing the operation of the circuit of FIG. 1.

In the circuit of FIG. 1 the input device is a multiplexer 10 shown as having eight inputs 11 through 18. The multiplexer is operated from a power supply connected between $V_{CC}$ terminal 19 and ground. Three address inputs 20, 21 and 22 determine which input is coupled to the output at node 23. For example, if the digital word address at terminals 20-22 is zero-zero-zero, input 11 will be coupled to node 23. A one-one-one address will cause input 18 to be coupled to node 23. Intermediate digital words will address other inputs and connect them to node 23. Thus, any input can be selected as desired. In the embodiment shown, input 11 is returned to $V_{CC}$ and input 18 is returned to ground. Thus, two reference inputs, relating to the extreme values, are present. Inputs 12-17 can then be used to accomodate six analog inputs as desired.

Line 24 provides an inhibit signal to multiplexer 10. As long as line 24 is low (near ground potential) multiplexer 10 will be operative as described above. When line 24 goes high (near $V_{CC}$) multiplexer 10 will be inhibited and its output will float thereby effectively disconnecting it from node 23. It is to be noted that typical multiplexer inhibit response can be short. Response times on the order of 0.2 microsecond are common with CMOS processing.

The circuit operates from a flip-flop 25 which consists of a pair of cross-connected two-input NOR gates 26 and 27. The circuit arrangement is such that node 28 is normally low and terminal 36 high. In this state no current will flow in the voltage divider consisting of resistors 29-32. Capacitor 33 will be charged to whatever analog voltage is present at node 23. Since the non-inverting input of comparator 34 is returned to substantially zero volts, any non-zero input on the inverting input will cause line 35 to remain low. Operational amplifier (op amp) 40 has its non-inverting input coupled to ground through resistor 32. Op amp 40 has its output connected to the base of transistor 41 and will therefore drive transistor 41 to produce zero volts across resistor 42. Thus, no current will flow through transistor 41.

To initiate a conversion a positive pulse is applied to start terminal 13. This pulse sets flip-flop 25 and node 28 goes high (close to $V_{CC}$). In FIG. 2 waveform A shows the start pulse and waveform B shows the voltage at node 28. Assuming that node 28 is at $V_{CC}$, a current will flow in resistors 29-32 depending upon their combined value. In a typical system for the following discussion the resistor values of Table 1 will be assumed along with a 5-volt $V_{CC}$.

TABLE I

| RESISTOR | VALUE (ohms) |
|---|---|
| 32 | MK |
| 31 | 2.5K |
| 30 | 500K |
| 29 | 47K |

Thus, resistor 32 will develop 0.1 volt, the non-inverting input to comparator 34 will be at 0.35 volt, and node 44 will be at 0.4 volt.

Since node 28 is high, line 24 will inhibit multiplexer 10. Thus, within a fraction of a microsecond after the start is applied, multiplexer 10 will disconnect node 23 from the input. This leaves capacitor 33 charged to the analog value at "start" or $t_o$.

Waveform C of FIG. 2 shows node 23 at the analog input value until the start of conversion at $t_o$. At this instant the 0.4 volt at node 44 will be added to the charge on capacitor 33 to produce the positive increment shown. Capacitor 33 will now start to discharge through transistor 41 which acts as a precise constant current device thereby to provide a constant slope in waveform C. The constant current action occurs as follows. It was noted above that resistor 32 will develop 0.1 volt. This is applied to the non-inverting input of op amp 40. The base of transistor 41 will be driven until the voltage across resistor 42 is also 0.1 volt. If resistor 42 is established at 10 K ohms, the current flowing in transistor 41 will be 10 microamperes and constant. Thus, as shown in waveform C, the potential at node 23 will ramp linearly toward zero volts.

The voltage at the non-inverting input of comparator 34 is 0.35 volt. When waveform C drops below this value comparator 34 will trip and node 35 will go high as shown in waveform D. This resets flip-flop 25 at time $t_1$, which is the end of the conversion for the relatively high analog input at node 23 that was applied at time $t_o$.

The dashed line waveform labeled C' represents a low value of analog input voltage at node 23 for time $t_o$. The 0.4 volt increment is still present but the waveform will cross the 0.35 volt level of $t_2$ which represents the conversion time for a small analog voltage. Even if the analog voltage were zero, the positive pulse would still be 0.05 volt above the 0.35 volt trip point. Thus, even a zero input has a finite time-out. Using a 100 microfared capacitor at 33 and a 10 microampere constant current, the zero volt time-out will be 5 microseconds. A 5 volt analog would produce a 0.5 millisecond time-out.

From the above it is clear that the pulse width of waveforms B or E will be the pulse width at node 28 or its complement at terminal 36. This pulse width will be a digital readout of the analog input. If desired, the pulse width can be the digital readout. However, if desired, counter 45 can be coupled to node 28 as shown. The counter will then provide the desired digital word output representing the analog input value at the start of conversion.

The converter is relatively noise immune. In fact, the only noise response that would produce an error would be noise impulses just prior to the application of the start pulse.

One of the main advantages of the converter is its ability to perform under the control of a microprocessor. As shown, all of the control functions are connected to microprocessor 46. It commands the start operation on line 47 and addresses multiplexer 10. Conversion data are available from node 28 as a pulse width or as a word from counter 45.

With microprocessor control the analog measurement can be expedited with software. Here the normal sequence for a 5-volt system would be:
1. Convert "zero" (address mutliplexer input 18, initiate "start" and read output).
2. Convert "5 V" (address multiplexer input 11, initiate "start" and read output).
3. Convert selected analog input (address one of multiplexer inputs 12-17, initiate "start" and read output).
   3a—Subtract "zero" from "5 V."
   3b—Divide result into "analog."

This microprocessor program will produce a reading that is in fractional units of 5 volts and that contains only linearity errors. The use of the constant current capacitor discharge makes the circuit highly linear.

EXAMPLE

The circuit of FIG. 1 was constructed using the following parts:

| COMPONENT | DESIGNATION |
|---|---|
| Multiplexer 10 | CD4051 (National Semiconductor) |
| Flip-flop 25 | MM74C02 (National Semiconductor) |
| Resistors 29-32 | See table above |
| Comparator 34 and Op amp 40 | LM2924 (National Semiconductor) |
| Transistor 41 | 2N5210 |
| Resistor 42 | 10K ohms |
| Capacitor 33 | 1000 picofarads |

The circuit could be operated in the 3 to 15 volt range but 5 volts was preferred. An eight bit A/D conversion accuracy was achieved over the analog range of zero to five volts.

While the invention has been described in the form of a preferred embodiment, there are other equivalents and alternatives within the spirit and intent of the invention. For example, if only a single analog input is desired, multiplexer 10 could be replaced with a single analog switch such as a field effect transistor or a CMOS transmission gate. This switch could be arranged to be off in response to inhibit line 24 as described. In this case address inputs 20-22 would not be used. Accordingly, it is intended that the scope of the invention be limited only by the claims that follow.

I claim:
1. An analog to digital converter for producing a digital output representative of an analog input voltage, said converter comprising
   a capacitor;
   means for charging said capacitor substantially to said analog voltage;
   means for starting a conversion interval in said converter;
   means responsive to said starting means for disconnecting said analog input voltage from said capacitor;
   means for generating a voltage increment and for coupling said increment in series with the charge on said capacitor;

means for discharging said capacitor at a constant current;

means for generating a non-zero reference potential having a value less than said voltage increment; and means responsive to the charge on said capacitor for terminating said conversion interval when said capacitor discharges to produce a potential equal to said reference potential whereby said interval is linearly proportional to said analog voltage and has a finite value for zero analog voltage.

2. The converter of claim 1 wherein said means for disconnecting comprises a multiplexer with a plurality of inputs selectable by digital addressing, said multiplexer including means for inhibiting all inputs responsive to said disconnecting means.

3. The converter of claim 1 wherein said means responsive to the charge on said capacitor comprises a comparator having one input coupled to said capacitor, the other input coupled to said reference potential, and an output to provide said means for terminating.

4. The converter of claim 3 wherein said means for discharging said capacitor comprises a transistor biased to maintain a constant collector current and said capacitor is coupled to the collector of said transistor.

5. The converter of claim 4 further including means for turning said transistor on only during said conversion interval.

6. An analog voltage to digital pulse converter circuit comprising in combination:

a bistable flip-flop having a first stable state defined as a conversion interval and a second stable state defined as a quiescent interval;

means for applying a set pulse to said flip-flop to initiate said conversion interval;

a capacitor;

means for coupling said capacitor to an analog voltage to be converted during said quiescent interval whereby said capacitor is charged to said analog voltage;

means for developing an increment of voltage and adding said increment to the charge on said capacitor during said conversion interval, said increment being small with respect to the expected range of analog voltages to be converted;

means for coupling a constant current load device to discharge said capacitor during said conversion interval, said discharge producing a linear decline in voltage with time;

means for developing a reference voltage that is greater than zero but less than said increment;

comparison means having two inputs and an output said inputs coupled to said capacitor and to said reference potential means and said output being coupled to said flip-flop to terminate said conversion interval when said capacitor voltage falls below said reference voltage whereby said conversion interval is linearly proportional to said analog voltage just prior to said initiation of said conversion interval.

* * * * *